United States Patent [19]

Kang et al.

[11] Patent Number: 5,455,131
[45] Date of Patent: Oct. 3, 1995

[54] METHOD FOR FABRICATION OF LITHOGRAPHY MASK

[75] Inventors: Chan H. Kang; Jun S. Lee, both of Seoul, Rep. of Korea

[73] Assignee: Goldstar Electron Co., Ltd., Rep. of Korea

[21] Appl. No.: 232,383

[22] Filed: Apr. 25, 1994

[51] Int. Cl.$^6$ ..................................... G03F 9/00
[52] U.S. Cl. .................. 430/5; 430/313; 430/315; 430/324; 430/394; 430/322
[58] Field of Search ................... 430/5, 313, 315, 430/322, 324, 394

[56] References Cited

U.S. PATENT DOCUMENTS 4,707,218  11/1987  Gianmarco et al. ................ 430/5
5,268,244  12/1993  Yoo ................................... 430/5

*Primary Examiner*—S. Rosasco
*Attorney, Agent, or Firm*—Poms, Smith, Lande & Rose

[57] ABSTRACT

This invention relates to a method for fabrication of masks suitable for improving semiconductor wafers in resolution, which comprises processes for depositing a phases shifting layer and an opaque layer on a transparent substrate, defining an opaque area and a transparent area and removing the opaque layer from the transparent area selectively, forming side wall on the sides of the opaque layer, and removing the exposed phase shifting layer selectively using the side walls and the opaque layer as a mask.

19 Claims, 4 Drawing Sheets

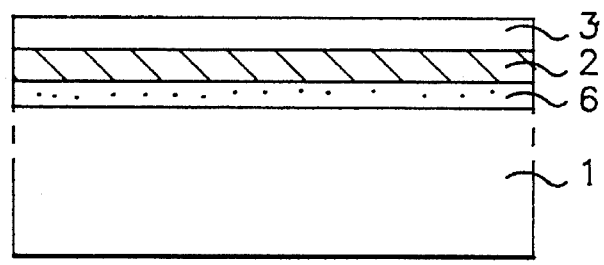
F I G.2a
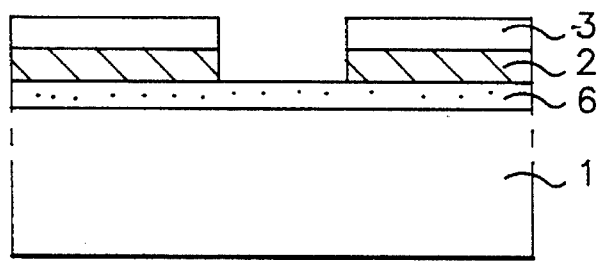
F I G.2b
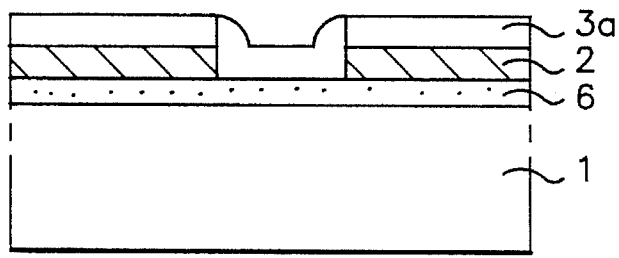
F I G.2c
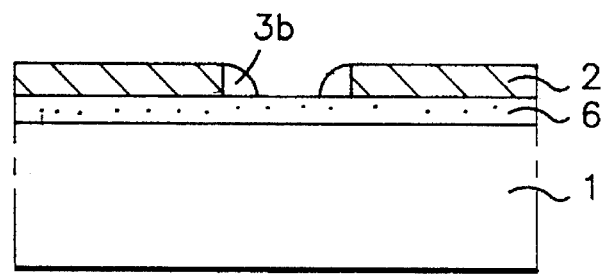
F I G.2d
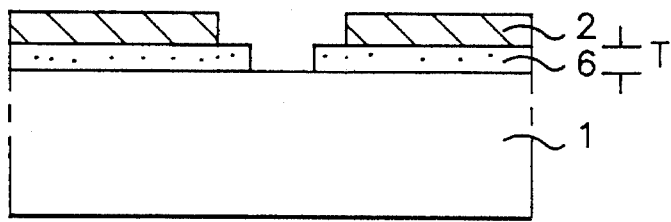
F I G.2e

METHOD FOR FABRICATION OF LITHOGRAPHY MASK

FIELD OF THE INVENTION

This invention relates to phase shifting masks, more particularly to a method for fabrication of masks suitable for improving semiconductor wafers in resolution.

BACKGROUND OF THE INVENTION

Recently, as semiconductor elements become highly integrated and the density of a package becomes high, arts to provide the semiconductor elements to have microscopic line width, are required.

Accordingly, methods for forming photo lithography masks having microscopic width are actively under research and development.

In general, photo lithography is an art for forming an image pattern on a surface of photo resist coated on a semiconductor substrate by passing rays like ultra-violet rays through a photo mask.

Such a photo mask consists of opaque pattern and transparent patterns, through patterns which rays like ultra-violet rays are passed selectively.

However, in such a photo lithography, diffraction phenomena develops as the density of the pattern increases, affecting the resolution.

As a method for solving such a problem, there is a method of photo lithography utilizing phase shifting mask.

A phase shifting mask is a method using combination of transparent areas phase shifted at 180 degrees against normal transparent areas, which develops an offset interference between transparent areas in opaque areas, preventing diffraction of lights.

And this phase shifting mask lithography technology can sharply demodulates the intensity of the light passing through the mask making the image of the pattern close to the image of the mask.

And many kind of phase shifting masks are under development so that even projections of more complicate pattern can be possible.

In the phase shifting masks, there are Levenson type and rim type.

In Levenson type, a transparent film shifting phase of light is formed on one part of transparent parts adjacent to other part. In rim type, a phase shifting layer having a fixed width is formed self-aligned around the periphery of a mask opening.

A foregoing rim type phase shifting mask is to be explained hereinafter, referring to the attached drawings.

Shown in FIGS. 1(a) to 1 (d) are sections explaining conventional method for fabrication of a mask, wherein, as shown in FIG. 1(a), an opaque layer 2 is deposited on a transparent substrate(glass or quartz), on which organic photo sensitive material 3 is coated.

Then, as shown in FIG. 1(b), a transparent area is defined by selective exposure and development, the opaque layer 2 of which is removed selectively to expose the transparent substrate. In this time, defects of the mask are repaired.

As shown in FIG. 1(c), the organic photo sensitive material 3 is removed with rotation coating method, on all over which phase shifting material of PMMA(Polymethyl Methacrylate) 4 is coated, which is exposed and developed using the opaque layer 2 as a mask to remove the PMMA 2 in the part having no opaque layer 2.

Then, by removing part of the opaque layer 2 with wet etching using the patterned PMMA 4 as a mask, the mask is completed. In the lithography mask structure fabricated as in the foregoing description, as shown in FIG. 1(d), an opaque layer 2 is formed on the transparent substrate 1 to block light selectively, on which opaque layer 2 phase shifting material of PMMA 4 is formed extending more into the transparent area from the edges of the opaque layer 2.

However, such a conventional lithography mask fabrication method has following problems.

First, control of thickness is difficult because the method of fabrication is carried out simply by forming phase shifting area of the PMMA 4 with rotation coating method.

Second, the flatness of phase shifting material of the PMMA 4 becomes bad due to the steps of the opaque layer.

Third, phase shifting material of the PMMA is susceptible to damage during handling of the mask.

Fourth, phase shifting material of PMMA has high possibility of particle infiltration during handling of the mask.

Fifth, phase shifting effect can be decreased due to development of under cut because the side walls of the opaque layer are formed with a wet etching.

SUMMARY OF THE INVENTION

The object of this invention designed for solving foregoing problems, is to provide a photo lithography mask which can improve resolution by changing the unstable surface step of the transparent substrate to a stable surface step and controlling to optimize the thickness of the phase shifting material.

These and other objects and features of this invention can be achieved by providing a method for fabricating a lithography mask including processes for depositing a phases shifting layer and an opaque layer on a transparent substrate, defining an opaque area and a transparent area and removing the opaque layer from the transparent area selectively, forming side walls on the sides of the opaque layer, and removing the exposed phase shifting layer selectively using the side walls and the opaque layer as a mask.

BRIEF DESCRIPTION OF THE DRAWINGS

FIGS. 2(a) to 2(e) are sections showing a method for fabricating a lithography mask in accordance with a first embodiment of this invention.

DETAILED DESCRIPTION OF THE INVENTION

Figure 1A:
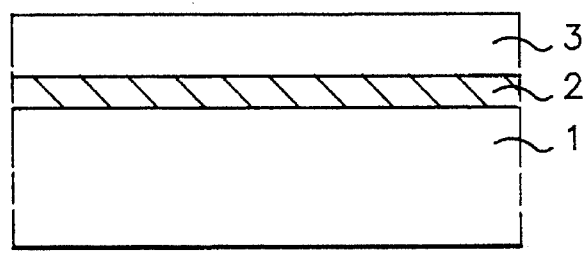
FIGS. 1(a) to 1(d) are sections showing a conventional method for fabricating a lithography mask.
Figure 1B:
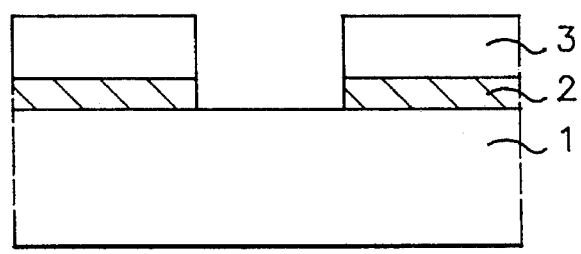
Figure 1C:
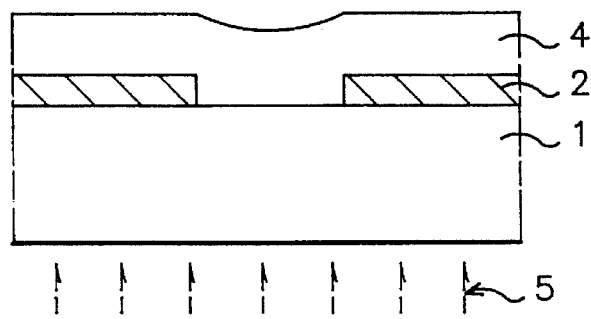
Figure 1D:
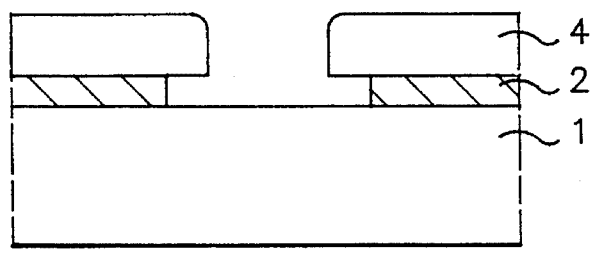

A method for fabricating a lithography mask in accordance with this invention is to be explained in detail hereinafter, referring to attached drawings.

FIGS. 2(a) to 2(e) are section showing a method for fabricating a lithography mask in accordance with a first embodiment of this invention.

In the method for fabrication of a lithography mask in accordance with the first embodiment of this invention, as shown in FIG. 2(a), a phase shifting layer 6, an opaque layer 2 and a first organic photo sensitive material 3 are deposited successively on a transparent substrate(quartz or glass) 1.

Herein, as for the phase shifting layer 6, a silicon oxide(SiO2), PMMA(Poly Methyl Methacrylate) or SOG(Spin On Glass) is used, as for the opaque layer 2, chrome(Cr) or aluminum(Al) is used, and, as for the organic sensitive material, a material which can be photo sensitive to ultra-violet rays, far ultra-violet rays or electron beams is used.

And the thickness of the phase shifting layer 6 is determined by an equation $T=\lambda/s(n-1)$, where $\lambda$ is exposing wave length and n is refractive index of the phase shifting layer against exposing wave length.

As shown in FIG. 2(b), the first organic photo sensitive material 3 is selectively exposed and developed to define a transparent area, of which opaque layer 2 is removed by vertical etching method selectively in subsequent process.

As shown in FIG. 2(c), the first organic photo sensitive material 3 is removed totally and on all over the surface of which a second organic photo sensitive material 3a is deposited.

AS shown in FIG. 2(d), the second organic photo sensitive material 3a is etched back without mask to form side wall organic photo sensitive material 3b on the side walls of the opaque layer 2.

As shown in FIG. 2(e), the exposed phase shifting layer 6 is removed selectively with vertical etching method using the opaque layer 2 and the side wall organic photo sensitive material as a mask to expose the transparent substrate 1, and the subsequent removal of the organic photo sensitive material 3b yields a completed lithography mask in accordance with the first embodiment of this invention.

Figure 3A:
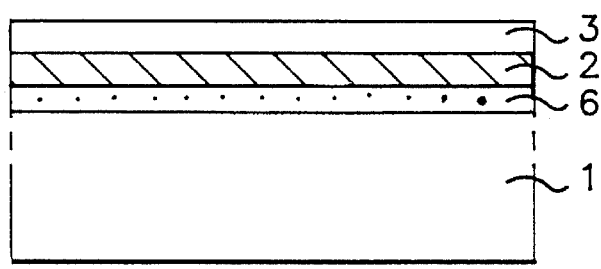
FIGS. 3(a) to 3(d) are sections showing a method for fabricating a lithography mask in accordance with a second embodiment of this invention.

On the other hand, FIGS. 3(a) to 3(d) are sections showing a method for fabricating a lithography mask in accordance with a second embodiment of this invention. In the method for fabricating a lithography mask in accordance with the second embodiment of this invention, as shown in FIG. 3(a), a phase shifting layer 6, an opaque layer 2 and a first organic photo sensitive material 3 are deposited on a transparent substrate(quartz or glass) successively.

Herein, as for the phase shifting layer 6, silicon oxide(SiO2), SOG(Spin On Glass) or PMMA(Polymethyl Methacrylate) are used, as for the opaque layer 2, chrome(Cr) or aluminum(Al) is used, and as for the organic photo sensitive material, materials photo sensitive to ultra-violet rays, far ultra-violet rays and electron beams are used.

And the thickness of the phase shifting layer 6 is determined by an equation $T=\lambda/2(n-1)$, where $\lambda$ is exposing wave length, n is refractive index of the phase shifting material against exposing wave length.

Figure 3B:
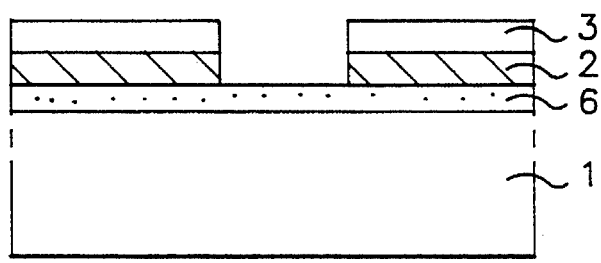

As shown in FIG. 3(b), the first organic sensitive material 3 is selectively exposed and developed to define a transparent area, of the opaque layer of which defined transparent area is removed with vertical etching method.

Figure 3C:
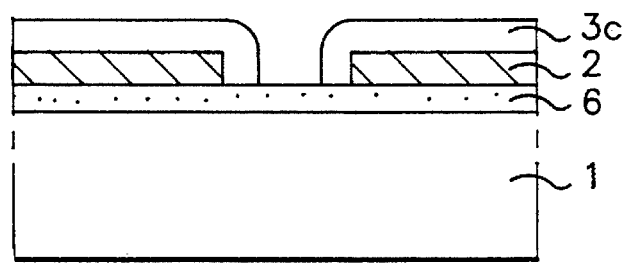

As shown in FIG. 3(c), the first organic photo sensitive material 3 the transparent area having been defined thereby is undertaken a heat treatment at a temperature of 250 degrees C. to cause thermal flow of the organic photo sensitive material to form side wall organic photo sensitive material 3c on the side walls of the opaque layer 2.

Then, the exposed phase shifting layer 6 is selectively removed with vertical etching method using the side wall organic photo sensitive material 3" as a mask, and subsequent removal of the side wall organic photo sensitive material 3" yields a completed lithography mask in accordance with the second embodiment of this invention.

The lithography mask fabricated in accordance with this invention as explained in foregoing description has following structure.

Figure 3D:
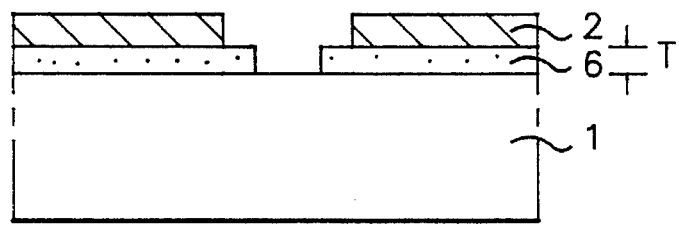

As shown in FIGS. 2(e) and 3(d), a phase shifting layer 6 is formed on the parts of the transparent substrate 1 except the transparent area, and the opaque layer is formed on the phase shifting area 6 except the edges of the phase shifting area.

The characteristics of the foregoing lithography mask fabricated in accordance with this invention is as follows.

Figure 4A:
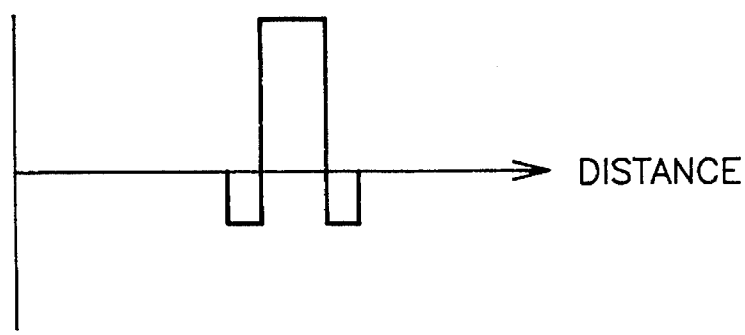
FIG. 4 explain the characteristics of a lithography mask in accordance with this invention.
Figure 4B:
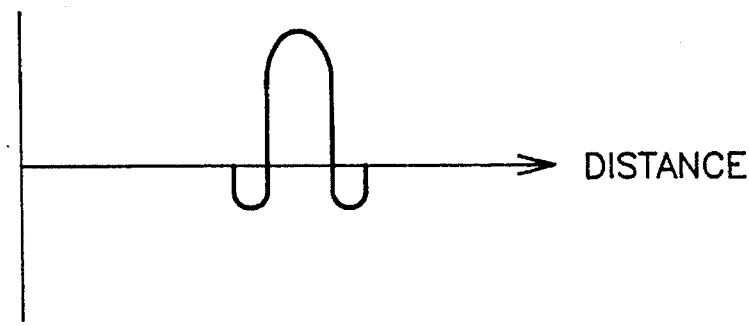
Figure 4C:
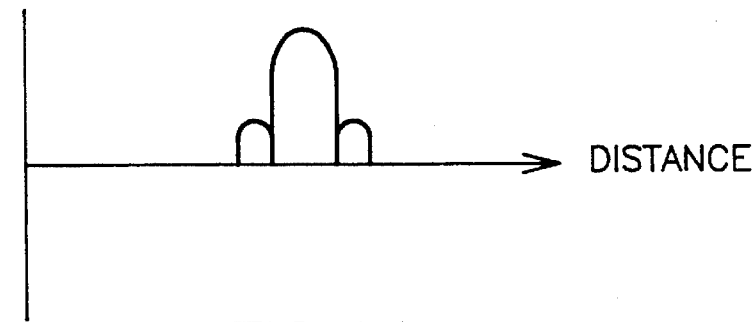

FIGS. 4(a) to 4(c) show span of transmission quantity and the span of light intensity on a wafer of a lithography mask in accordance with this invention.

Shown in FIG. 4(a) is phase of transmitted light beneath the mask after having passed through the lithography mask in accordance with this invention, which explains that the phase of the light having transmitted has been shifted at the edges of the opaque area by the phase shifting layer.

Figure 4D:
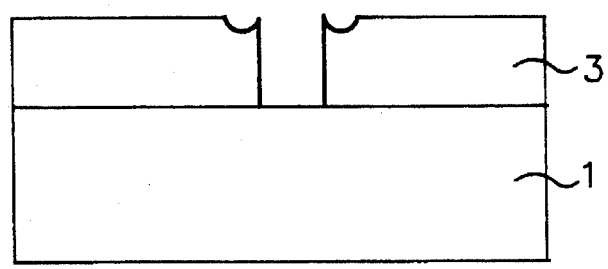

Shown in FIG. 4(b) is span of light on a photo sensitive material coated wafer, FIG. 4(c) is photo sensitivity on a photo sensitive material coated wafer, and FIG. 4(d) is a profile of a patterned section when a contact hole has been undertaken patterning using a mask in accordance with this invention, which exhibits that, because control of the thickness of a phase shifting lay is easy, easiness of demarcation of the line width and steeper profile.

The advantages of the fabrication method in accordance with this invention as explained in foregoing description are as follows.

First, because an opaque layer is formed on a phase shifting layer, control of the thickness of the phase shifting layer is made easier which enables to improve resolution.

Second, because the edge width of the phase shifting layer is fixed according to the angle of the side wall of the organic photo sensitive material, the phase shifting layer can be undertaken patterning in self-aligning way without a mask process making the process easy.

Third, because the side walls of the opaque layer and the phase shifting layer are formed with vertical etching, side wall profile is formed good.

Fourth, at the time of forming an isolated type of pattern such as for contact holes, the fabrication can be carried out more easily.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a lithography mask, comprising the steps of:

depositing a phase shifting layer on a transparent substrate;

depositing an opaque layer on the phase shifting layer;

defining an opaque area and a transparent area and selectively removing the opaque layer from the transparent area;

forming sidewall spacers of sidewalls of the opaque layer; and using the sidewall spacers and the opaque layer as a mask, selectively removing the exposed phase shifting layer.

2. The method as claimed in claim 1 wherein said opaque layer removing step and said phase shifting layer removing step both include vertical etching.

3. The method as claimed in claim 1 wherein the sidewall spacers are formed as the mask so as to obtain a pattern of the phase shifting layer which is wider than the opaque layer.

4. The method as claimed in claim 1 wherein the opaque area and the transparent area are defined on the opaque layer.

5. The method as claimed in claim 1 further comprising after said phase shifting layer removing step, removing the sidewall spacers.

6. The method as claimed in claim 1 wherein the sidewall spacers are formed of organic photosensitive material.

7. A method for fabricating a lithography mask, comprising the steps of:

depositing a phase shifting layer on a transparent substrate;

depositing an opaque layer on the phase shifting layer;

depositing a first organic photosensitive material on the opaque layer;

selectively exposing and developing the first organic photosensitive material to define an opaque area and a transparent area;

selectively removing the opaque layer of the transparent area;

removing the first organic photosensitive material;

forming second organic photosensitive material sidewall spacers of sidewalls of the opaque layer; and using the opaque layer and the second organic photosensitive material sidewall spacers as a mask, selectively removing the exposed phase shifting layer.

8. The method as claimed in claim 7 wherein the transparent substrate comprises a transparent quartz substrate.

9. The method as claimed in claim 7 wherein the first and the second organic photosensitive materials comprise materials photosensitive to ultra-violet rays, far ultra-violet rays and electron beams.

10. The method as claimed in claim 7 wherein the opaque layer is constructed of chrome.

11. The method as claimed in claim 7 wherein the opaque layer is constructed of aluminum.

12. The method as claimed in claim 7 wherein the phase shifting layer comprises a silicon oxide film.

13. The method as claimed in claim 7 wherein the phase shifting material comprises spin on glass.

14. The method as claimed in claim 7 wherein the phase shifting material comprises polymethyl methacrylate.

15. The method as claimed in claim 7 wherein a thickness T of the phase shifting layer is determined by the equation of $T=\lambda/2 (n-1)$, where $\lambda$ is a wavelength of an exposing light and n is a refractive index of the phase shifting layer against the exposing light.

16. A method of fabricating a lithography mask, comprising the steps of:

depositing a phase shifting layer on a transparent substrate;

depositing an opaque layer on the phase shifting layer;

depositing an organic photosensitive material on the opaque layer;

exposing and developing the organic photosensitive material selectively to define an opaque area and a transparent area;

selectively removing the opaque layer of the transparent area;

forming sidewall spacers of the organic photosensitive material on opaque layer sidewalls by heat treatment of the organic photosensitive material; and using the opaque layer and the sidewall spacers of the organic photosensitive material as a mask, etching the exposed phase shifting layer.

17. The method as claimed in claim 16 wherein the heat treatment is carried out so as to cause thermal flow.

18. The method as claimed in claim 16 further comprising after said etching step, removing the sidewall spacers.

19. The method as claimed in claim 16 wherein the sidewall spacers are formed as a mask to obtain a pattern of the phase shifting layer wider than the opaque layer.

* * * * *